United States Patent
Tanaka

(10) Patent No.: US 11,996,156 B2
(45) Date of Patent: May 28, 2024

(54) SEMICONDUCTOR INTEGRATED CIRCUIT AND MEMORY SYSTEM

(71) Applicant: KIOXIA CORPORATION, Tokyo (JP)

(72) Inventor: Atsushi Tanaka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/896,871

(22) Filed: Aug. 26, 2022

(65) Prior Publication Data

US 2023/0121722 A1 Apr. 20, 2023

(30) Foreign Application Priority Data

Oct. 18, 2021 (JP) .................... 2021-170289

(51) Int. Cl.
G11C 29/00 (2006.01)
G11C 29/12 (2006.01)

(52) U.S. Cl.
CPC ...... *G11C 29/12* (2013.01); *G11C 2029/1206* (2013.01)

(58) Field of Classification Search
CPC .................. G11C 29/12; G11C 2029/1206
See application file for complete search history.

(56) References Cited

U.S. PATENT DOCUMENTS

| | | | |
|---|---|---|---|
| 6,480,799 B2 | 11/2002 | Hunter | |
| 9,443,616 B2 | 9/2016 | Chen et al. | |
| 10,803,970 B2 | 10/2020 | Schuh et al. | |
| 2006/0253266 A1 | 11/2006 | Ong | |
| 2007/0083705 A1 | 4/2007 | Kuwashima et al. | |
| 2009/0282305 A1 | 11/2009 | Chen et al. | |
| 2010/0293406 A1 | 11/2010 | Welker et al. | |
| 2011/0063909 A1 | 3/2011 | Komatsu | |
| 2018/0102182 A1* | 4/2018 | Zhou | G11C 29/36 |
| 2021/0318376 A1* | 10/2021 | Hsiao | G11C 29/00 |

(Continued)

FOREIGN PATENT DOCUMENTS

| | | |
|---|---|---|
| JP | 2007-102653 A | 4/2007 |
| JP | 4991811 B2 | 8/2012 |
| JP | 2014-535120 A | 12/2014 |

(Continued)

OTHER PUBLICATIONS

Fujitsu Limited "White paper:End-to-end Data Protection Using Oracle Linux with the ETERNUS DX S3 series and QLogic 2600 Series FC HBA: Greatly improving the reliability of the entire system" White paper, FUJITSU Storage ETERNUS DX series, Fujitsu Limited, 2015, pp. 1-5. URL: https://www.fujitsu.com/downloads/strsys/system/dx_s3_Oracle_Linux_T10_PI_Q_en_011.pdf.

*Primary Examiner* — Christine T. Tu
(74) *Attorney, Agent, or Firm* — Kim & Stewart LLP

(57) ABSTRACT

A semiconductor integrated circuit includes a write test circuit and a read test circuit. The write test circuit generates test data and transmits the generated test data to an external memory device without storing the test data in a local memory device. The read test circuit receives from the external memory device, read data that the external memory device has obtained by reading the test data, and compares the received read data with an expected value without storing either the read data or the expected value in the local memory device.

20 Claims, 16 Drawing Sheets

(56) References Cited

U.S. PATENT DOCUMENTS

2022/0137859 A1\* 5/2022 Ahn .................... G06F 3/0679
711/154
2022/0269513 A1\* 8/2022 Su ....................... G06F 3/0659

FOREIGN PATENT DOCUMENTS

| TW | 200947450 A | 11/2009 |
| TW | I521507 B | 2/2016 |

\* cited by examiner

| FORMAT 1 | GUARD GRD (2B) |
| FORMAT 2 | APPLICATION TAG APP (2B) |
| FORMAT 3 | REFERENCE TAG REF (4B) |

FIG. 15B

MEMORY ADDRESS 0X0200

| beat | 0 |
|---|---|
| RD3 | 2 |
| RD2 | 1 |
| RD1 | 0 |
| RD0 | 64 |

MEMORY ADDRESS 0X0208

| beat | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| RD3 | 2 | 6 | 10 | 14 | 18 | 22 | 26 | 30 | 34 | 38 | 42 | 46 | 50 | 54 | 58 | 62 |
| RD2 | 1 | 5 | 9 | 13 | 17 | 21 | 25 | 29 | 33 | 37 | 41 | 45 | 49 | 53 | 57 | 61 |
| RD1 | 0 | 4 | 8 | 12 | 16 | 20 | 24 | 28 | 32 | 36 | 40 | 44 | 48 | 52 | 56 | 60 |
| RD0 | -1 | 3 | 7 | 11 | 15 | 19 | 23 | 27 | 31 | 35 | 39 | 43 | 47 | 51 | 55 | 59 |

MEMORY ADDRESS 0X0400

| beat | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| RD3 | 1 | 5 | 9 | 13 | 17 | 21 | 25 | 29 | 33 | 37 | 41 | 45 | 49 | 53 | 57 | 61 |
| RD2 | 0 | 4 | 8 | 12 | 16 | 20 | 24 | 28 | 32 | 36 | 40 | 44 | 48 | 52 | 56 | 60 |
| RD1 | 64 | 3 | 7 | 11 | 15 | 19 | 23 | 27 | 31 | 35 | 39 | 43 | 47 | 51 | 55 | 59 |
| RD0 | 63 | 2 | 6 | 10 | 14 | 18 | 22 | 26 | 30 | 34 | 38 | 42 | 46 | 50 | 54 | 58 |

| # | DETERMINATION BY ADDRESS | QW COUNTER |
|---|---|---|
| #1 | raddr [4:0] ! = 0 | 0-raddr [4:3] |
| #2 | raddr mod SECTOR SIZE (INCLUDING PI) = 0 | 0 |
| #3 | OTHER THAN # 1 AND # 2 | MAINTAIN AT PREVIOUS VALUE |

FIG. 17A

MEMORY ADDRESS 0X0000

| beat | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| RD3 | 3 | 7 | 11 | 15 | 19 | 23 | 27 | 31 | 35 | 39 | 43 | 47 | 51 | 55 | 59 | 63 |
| RD2 | 2 | 6 | 10 | 14 | 18 | 22 | 26 | 30 | 34 | 38 | 42 | 46 | 50 | 54 | 58 | 62 |
| RD1 | 1 | 5 | 9 | 13 | 17 | 21 | 25 | 29 | 33 | 37 | 41 | 45 | 49 | 53 | 57 | 61 |
| RD0 | 0 | 4 | 8 | 12 | 16 | 20 | 24 | 28 | 32 | 36 | 40 | 44 | 48 | 52 | 56 | 60 |

MEMORY ADDRESS 0X0200

| beat | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| RD3 | 2 | 6 | 10 | 14 | 18 | 22 | 26 | 30 | 34 | 38 | 42 | 46 | 50 | 54 | 58 | 62 |
| RD2 | 1 | 5 | 9 | 13 | 17 | 21 | 25 | 29 | 33 | 37 | 41 | 45 | 49 | 53 | 57 | 61 |
| RD1 | 0 | 4 | 8 | 12 | 16 | 20 | 24 | 28 | 32 | 36 | 40 | 44 | 48 | 52 | 56 | 60 |
| RD0 | 64 | 3 | 7 | 11 | 15 | 19 | 23 | 27 | 31 | 35 | 39 | 43 | 47 | 51 | 55 | 59 |

3

MEMORY ADDRESS 0X0400

| beat | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| RD3 | 1 | 5 | 9 | 13 | 17 | 21 | 25 | 29 | 33 | 37 | 41 | 45 | 49 | 53 | 57 | 61 |
| RD2 | 0 | 4 | 8 | 12 | 16 | 20 | 24 | 28 | 32 | 36 | 40 | 44 | 48 | 52 | 56 | 60 |
| RD1 | 64 | 3 | 7 | 11 | 15 | 19 | 23 | 27 | 31 | 35 | 39 | 43 | 47 | 51 | 55 | 59 |
| RD0 | 63 | 2 | 6 | 10 | 14 | 18 | 22 | 26 | 30 | 34 | 38 | 42 | 46 | 50 | 54 | 58 |

3

SEMICONDUCTOR INTEGRATED CIRCUIT AND MEMORY SYSTEM

CROSS-REFERENCE TO RELATED APPLICATION(S)

This application is based upon and claims the benefit of priority from Japanese Patent Application No. 2021-170289, filed Oct. 18, 2021, the entire contents of which are incorporated herein by reference.

FIELD

Embodiments described herein relate to a technique for testing a target device.

BACKGROUND

Memory systems including a nonvolatile memory are known. An example of such memory systems is a solid state drive (SSD). Various tests are required for the development and manufacture of the SSD.

Since the SSD operates in response to a command from a host, in order to test the SSD, a test device needs to have a host function of sending a command to the SSD, receiving a response to the command, and checking whether the response is correct. An example of a device having the host function is a personal computer. In many cases, a personal computer does not support the latest interface protocol of an SSD under development. Another example of the device having the host function is an exerciser, which is expensive. Still another example of the device having the host function is a dedicated test device. The development cost of the dedicated test device is high.

DESCRIPTION OF THE DRAWINGS

FIG. 14 is a diagram showing an example of a memory map of the register according to the first embodiment.

FIGS. 15A to 15D are diagrams illustrating an example of write data generated by the host mode module according to the first embodiment.

FIG. 16 is a diagram illustrating processing of initializing a Q word counter by the host mode module according to the first embodiment.

FIGS. 17A to 17C are diagrams illustrating another example of the write data generated by the host mode module according to the first embodiment.

FIG. 18 is a block diagram showing an example of an SSD including a semiconductor integrated circuit according to a second embodiment.

DETAILED DESCRIPTION

Figure 1:
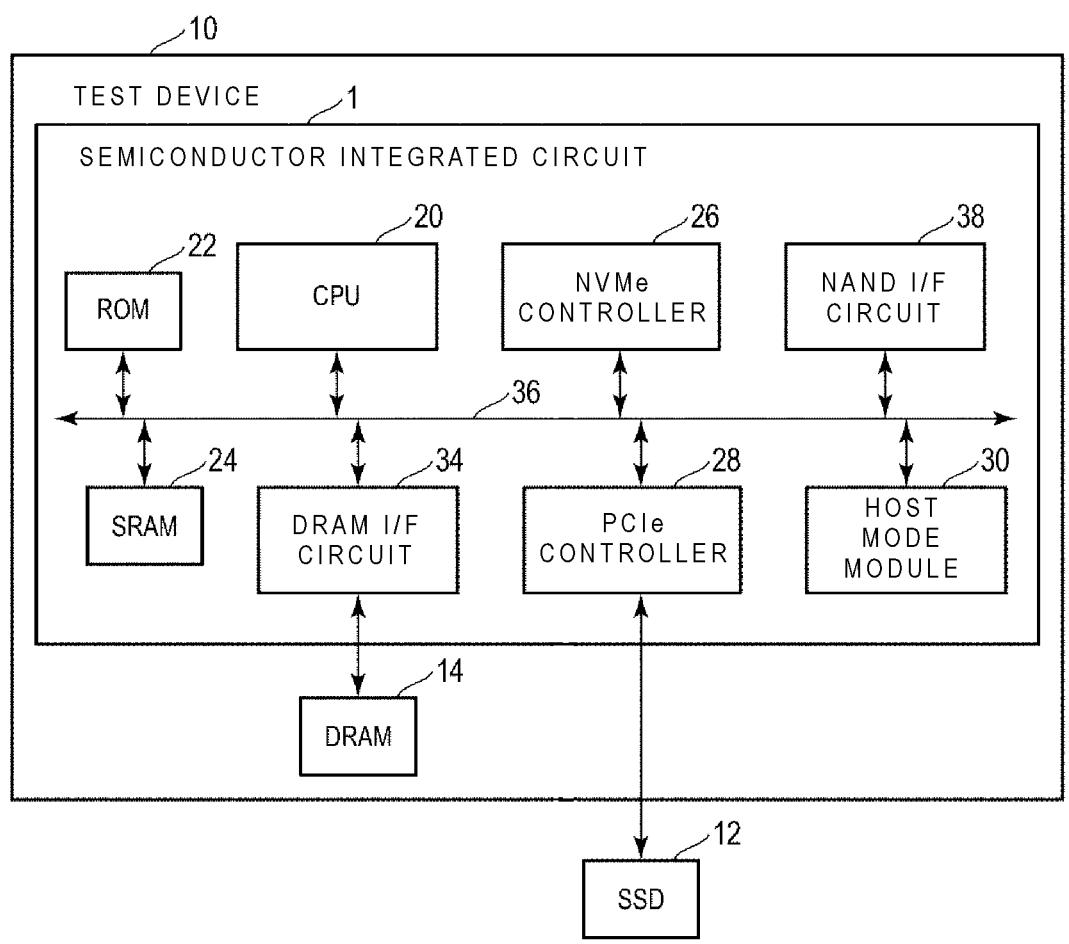
FIG. 1 is a block diagram showing an example of a test device including a semiconductor integrated circuit according to a first embodiment.

Embodiments provide an inexpensive semiconductor integrated circuit for testing a target device.

In general, according to one embodiment, the semiconductor integrated circuit includes a write test circuit and a read test circuit. The write test circuit generates test data and transmits the generated test data to an external memory device without storing the test data in a local memory device. The read test circuit receives from the external memory device, read data that the external memory device has obtained by reading the test data, and compares the received read data with an expected value without storing either the read data or the expected value in the local memory device.

Hereinafter, embodiments will be described with reference to the drawings. The following description provides examples of devices and methods for embodying technical ideas of the embodiments, and the technical ideas of the embodiments are not limited to structures, shapes, arrangements, materials, and the like of elements described below. Modifications that can be easily conceived by those skilled in the art are naturally within the scope of this disclosure. In order to clarify the description, in the drawings, a size, thickness, plane dimension, shape, and the like of each component may be changed and schematically represented instead of the actual ones. Across a plurality of drawings, components may be depicted to have different dimensional relationships and ratios. Across a plurality of drawings, corresponding components may be given the same reference number to omit duplicate description. Although a plurality of names may be given to some components, these names are illustrative only, and the components may be given other names. It should be noted that in the following description, "connection" means not only a direct connection but also a connection via other components.

First Embodiment

Hereinafter, the present embodiment will be described in detail with reference to the drawings. A target device whose operation is tested by a semiconductor integrated circuit according to the embodiment may be any device, and an SSD will be described below as an example.

FIG. 1 is a block diagram showing an example of a test device 10 including a semiconductor integrated circuit 1 according to the first embodiment. The test device 10 is connected to an SSD 12 which is a test target. The test device 10 includes the semiconductor integrated circuit 1. The test device 10 may further include a dynamic random access memory (DRAM) 14. The semiconductor integrated circuit 1 may be formed by a circuit such as a system-on-a chip (SoC). Function of each part of the semiconductor integrated circuit 1 may be implemented by dedicated hardware, a processor that executes a program (firmware), or a combination thereof.

The semiconductor integrated circuit 1 includes a central processing unit (CPU) 20, a read only memory (ROM) 22, a static random access memory (SRAM) 24, an NVM Express (NVMe®) controller 26, a PCI Express (PCIe®) controller 28, a host mode module 30, a DRAM interface (DRAM I/F) circuit 34, and a NAND interface (NAND I/F) circuit 38.

The CPU 20, the ROM 22, the SRAM 24, the NVMe controller 26, the PCIe controller 28, the host mode module 30, the DRAM I/F circuit 34, and the NAND I/F circuit 38 are connected to a bus line 36. The PCIe controller 28 is connected to the SSD 12. The DRAM I/F circuit 34 is connected to the DRAM 14. The NAND I/F circuit 38 may be connected to a nonvolatile memory (not shown). An example of the nonvolatile memory is a NAND flash memory (hereinafter, simply referred to as a NAND memory).

The CPU 20 controls each part of the semiconductor integrated circuit 1 by executing the firmware. The ROM 22 stores the firmware. The SRAM 24 is used as a work area of the CPU 20. The CPU 20 issues a command according to the NVMe standard. The PCIe controller 28 is an interface circuit for connecting the semiconductor integrated circuit 1 to the SSD 12. The host mode module 30 generates data to be transmitted to the SSD 12 which is a test target. Further, the host mode module 30 generates an expected value for data received from the SSD 12 which is a test target. The DRAM I/F circuit 34 controls access to the DRAM 14. The NAND I/F circuit 38 controls access to the nonvolatile memory. The NAND I/F circuit 38 may have a function of correcting an error included in data read from the nonvolatile memory.

Figure 2:
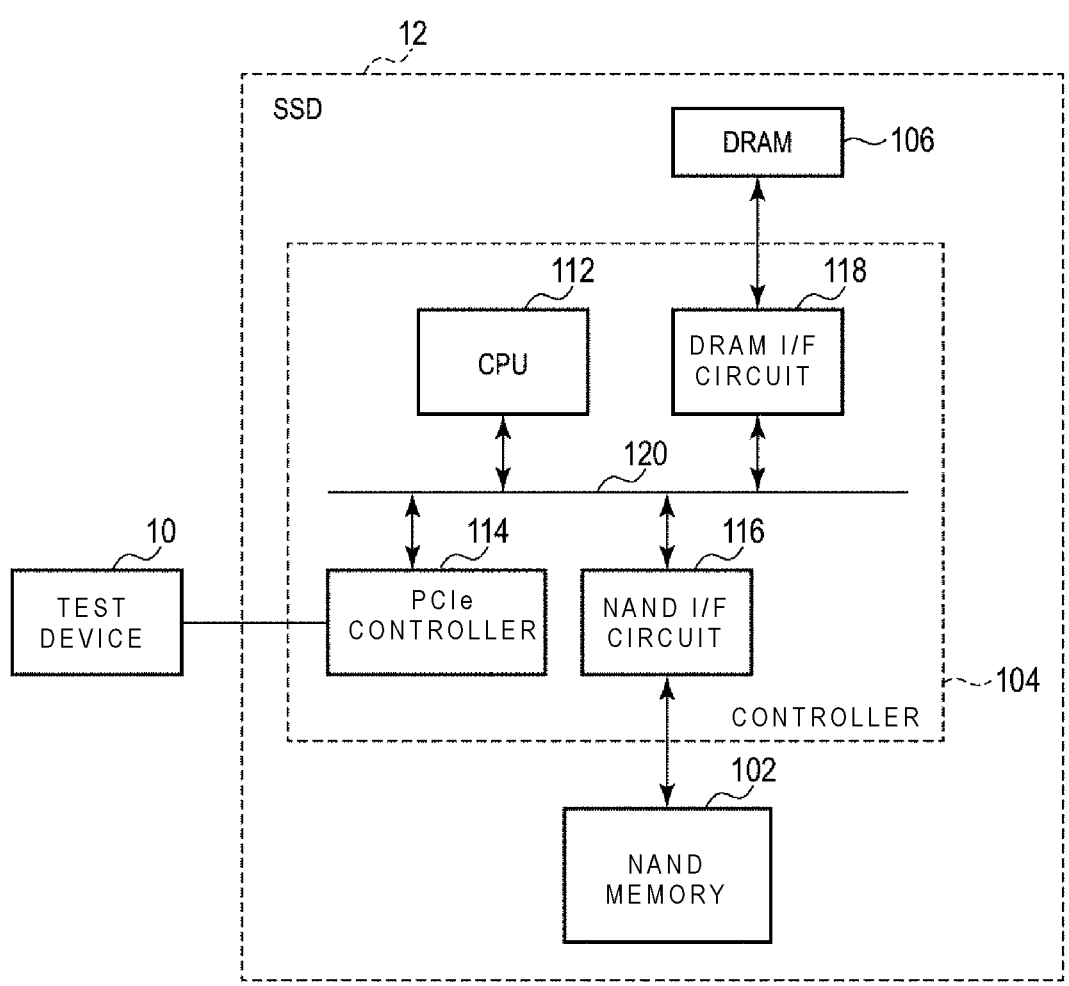
FIG. 2 is a block diagram showing an example of an SSD that is a test target of the test device according to the first embodiment.

FIG. 2 is a block diagram showing an example of the SSD 12. The SSD 12 is used when connected to a host device (hereinafter, simply referred to as a host). The host is an information processing device that accesses the SSD 12. However, during a test, the SSD 12 is connected to the test device 10 instead of the host, as shown in FIG. 2. The SSD 12 is an example of an external memory device.

The SSD 12 is a storage device configured to write data to the nonvolatile memory or read data from the nonvolatile memory in response to a command from the host or the test device 10. In the description of the present embodiment, the nonvolatile memory is a NAND memory.

The SSD 12 includes a NAND memory 102, a controller 104, and a DRAM 106.

The controller 104 functions as a memory controller configured to control the NAND memory 102. The controller 104 may be formed by a circuit such as an SoC. The controller 104 writes data to the NAND memory 102 or reads data from the NAND memory 102 according to a command from the host or the test device 10.

The DRAM 106 may be provided inside the controller 104. The SSD 12 may include an SRAM instead of the DRAM 106.

The NAND memory 102 may include a plurality of flash memory chips. The NAND memory 102 includes a memory cell array. The memory cell array includes a plurality of memory cells arranged in a matrix. The NAND memory 102 may have a two-dimensional structure or a three-dimensional structure.

The controller 104 includes a CPU 112, a PCIe controller 114, a NAND interface (NAND I/F) circuit 116, and a DRAM interface (DRAM I/F) circuit 118.

The CPU 112, the PCIe controller 114, the NAND I/F circuit 116, and the DRAM I/F circuit 118 are connected to a bus line 120. The CPU 112 executes firmware stored in the NAND memory 102 and implements various functions.

The PCIe controller 114 is electrically connected to the test device 10. The PCIe controller 114 is an interface circuit that connects the SSD 12 to the test device 10. The NAND I/F circuit 116 is electrically connected to the NAND memory 102. The NAND I/F circuit 116 controls access to the NAND memory 102. The DRAM I/F circuit 118 is electrically connected to the DRAM 106. The DRAM I/F circuit 118 controls access to the DRAM 106.

Figure 3:
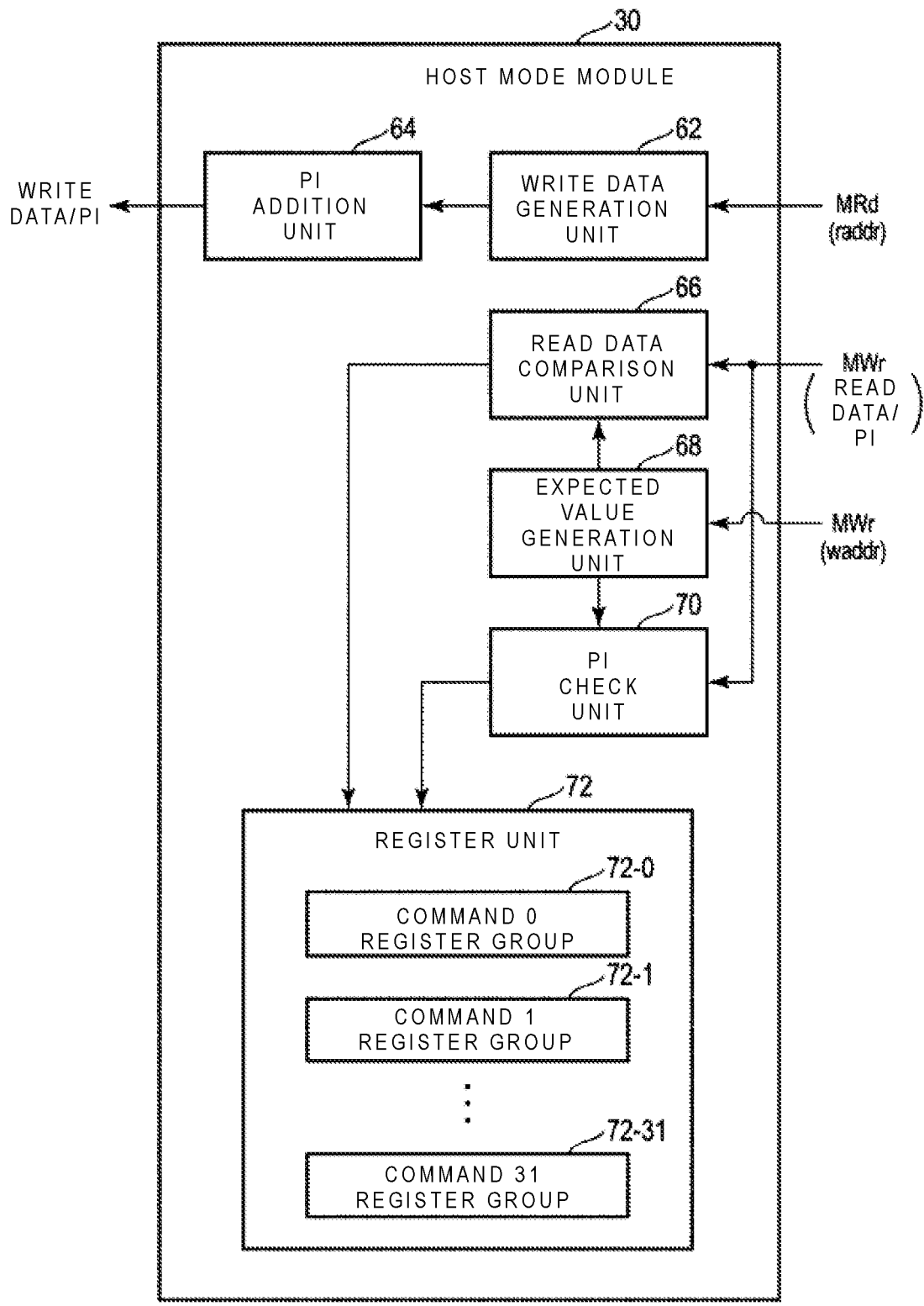
FIG. 3 is a block diagram showing an example of a host mode module according to the first embodiment.

FIG. 3 is a block diagram showing an example of the host mode module 30 of the semiconductor integrated circuit 1 according to the first embodiment. The host mode module 30 includes circuitry for performing a write test and a read test, such as a write data generation unit 62, a protection information (PI) addition unit 64, a read data comparison unit 66, an expected value generation unit 68, a PI check unit 70, and a register unit 72. The host mode module 30 performs a write test using the write data generation unit 62 and the PI addition unit 64, and a read test using the read data comparison unit 66, the expected value generation unit 68, and the PI check unit 70. Accordingly, as used herein, a write test circuit includes the write data generation unit 62 and the PI addition unit 64, and a read test circuit includes the read data comparison unit 66, the expected value generation unit 68, and the PI check unit 70.

The test device 10 can issue a write command and a read command to the SSD 12. The write command specifies an address of a physical memory in a host (here, test device 10) in which data to be transferred to the SSD 12 is stored, and a logical address associated with the data to be transferred. An example of the logical address is a logical block address (LBA). Upon receiving the write command, the SSD 12 transmits a memory read request MRd defined according to the PCIe standard. The memory read request MRd is in the form of a transaction layer packet (TLP). The memory read request MRd requests the host to transfer, to the SSD 12, the data stored in the physical memory of the host. The memory read request MRd includes an address raddr of the physical memory in which the data to be transferred to the SSD 12 is stored. The address raddr corresponds to the address specified by the write command.

Upon receiving the memory read request MRd, the write data generation unit 62 generates write data according to the address raddr included in the memory read request MRd. The PI addition unit 64 then adds PI to the write data. The PI is data for checking whether the data is transmitted and received without an error. For example, the PI includes a cyclic redundancy check (CRC) code for detecting an error in the data. A packet including the write data and the PI is transmitted to the SSD 12 as a response to the memory read request MRd, and is stored in the SSD 12 (more specifically, the NAND memory 102).

The read command specifies an address of a physical memory of a host (here, test device 10) in which data to be transferred from the SSD 12 should be stored, and a logical address associated with the data to be transferred. An example of the logical address is an LBA. Upon receiving the read command, the SSD 12 transmits a memory write request MWr defined according to the PCIe standard. The memory write request MWr is in the form of TLP. The memory write request MWr includes read data read from the SSD 12 (more specifically, the NAND memory 102) and an address waddr of the physical memory to which the read data is transferred. The address waddr corresponds to the address specified by the read command. The memory write request MWr may further include the PI read from the SSD 12.

Upon receiving the memory write request MWr, the expected value generation unit 68 generates an expected value of the read data according to the address waddr included in the memory write request MWr. The expected value generation unit 68 generates the expected value of the read data according to the address waddr in the same manner as the write data generation unit 62 generates the write data. The expected value generation unit 68 also generates an expected value of the PI based on the expected value of the read data that it generated. The expected value generation unit 68 transmits the generated expected value to the read data comparison unit 66 and the generated expected value of the PI to the PI check unit 70.

Upon receiving the memory write request MWr, the read data comparison unit 66 compares the read data included in the memory write request MWr with the expected value generated by the expected value generation unit 68. When the write data is correctly written to the SSD 12 and correctly read from the SSD 12, the read data matches the expected value.

The PI check unit 70 checks an error in the read data based on the PI included in the memory write request MWr and the PI generated by the expected value generation unit 68. When the PI is not included in the memory write request MWr, the PI check unit 70 does not check for an error in the read data.

A comparison result by the read data comparison unit 66 and a check result of the PI check unit 70 are stored in the register unit 72. The register unit 72 stores a set value for each command and the comparison result/check result. The register unit 72 has a register group for each command. For example, the register unit 72 has a command 0 register group 72-0 to a command 31 register group 72-31, for 32 commands.

Figure 4:
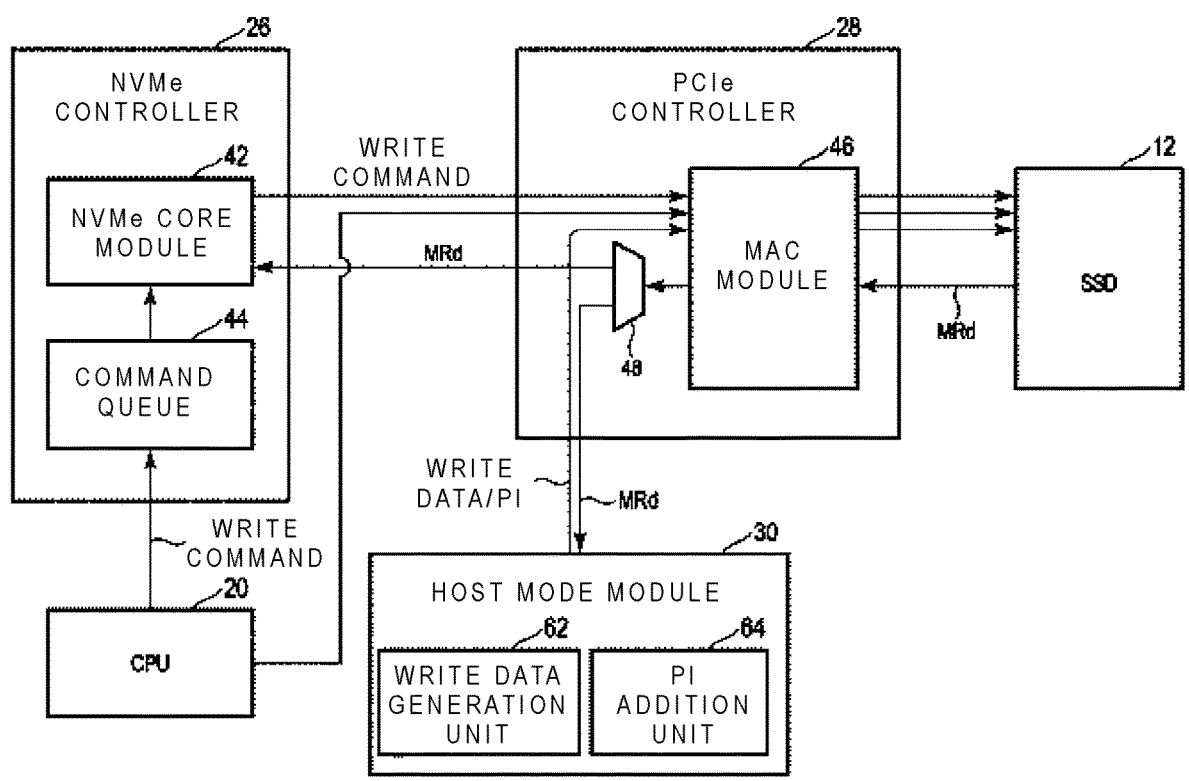
FIG. 4 is a diagram illustrating an example of write data generation by the host mode module according to the first embodiment.

FIG. 4 is a diagram illustrating an example of write data generation by the host mode module 30 according to the first embodiment. The NVMe controller 26 includes an NVMe core module 42 and a command queue 44. The command queue 44 may be provided in the SRAM 24 or the DRAM 14.

The PCIe controller 28 includes a media access control (MAC) module 46 and a selection circuit 48. The MAC module 46 is connected to the SSD 12. The selection circuit 48 selectively supplies a signal from the MAC module 46 to the host mode module 30 or the NVMe controller 26.

The CPU 20 generates a write command requesting the SSD 12 to write data and writes the write command to the command queue 44. Further, the CPU 20 sets any one of the command 0 register group 72-0 to the command 31 register group 72-31 according to an operation that should be performed by the SSD 12 based on the write command.

The CPU 20 notifies the SSD 12 via the PCIe controller 28 that the command was written to the command queue 44. Upon receiving the notification, the SSD 12 transmits a memory read request MRd requesting to read the command from the command queue 44. The NVMe core module 42 receives the memory read request MRd via the PCIe controller 28. The NVMe core module 42 reads the write command from the command queue 44 and transmits the write command to the SSD 12 via the PCIe controller 28.

Upon receiving the write command, the SSD 12 transmits a memory read request MRd requesting to read write data. The MAC module 46 receives the memory read request MRd transmitted by the SSD 12 in response to the write command. The MAC module 46 transmits the memory read request MRd to the write data generation unit 62 of the host mode module 30 via the selection circuit 48.

The selection circuit 48 switches a transmission destination of the memory read request MRd between the write data generation unit 62 of the host mode module 30 and the NVMe controller 26 according to the address raddr included in the memory read request MRd. When the address raddr corresponds to an address included in the transmitted write command, the selection circuit 48 sets the write data generation unit 62 of the host mode module 30 as the transmission destination of the memory read request MRd. When the address raddr does not correspond to the address included in the transmitted write command, the selection circuit 48 sets the NVMe controller 26 as the transmission destination of the memory read request MRd.

Upon receiving the memory read request MRd, the write data generation unit 62 generates write data according to the address raddr included in the memory read request MRd. The PI addition unit 64 adds PI to the write data. It should be noted that the addition of the PI is optional. It is also possible to select not to add PI by configuring the host mode module 30 accordingly. The MAC module 46 transmits, to the SSD 12 as a response to the memory read request MRd, a packet including the write data output from the write data generation unit 62 or the PI output from the PI addition unit 64. The SSD 12 writes the write data or the PI to a storage location in the NAND memory 102 corresponding to the logical address specified by the write command.

Figure 5:
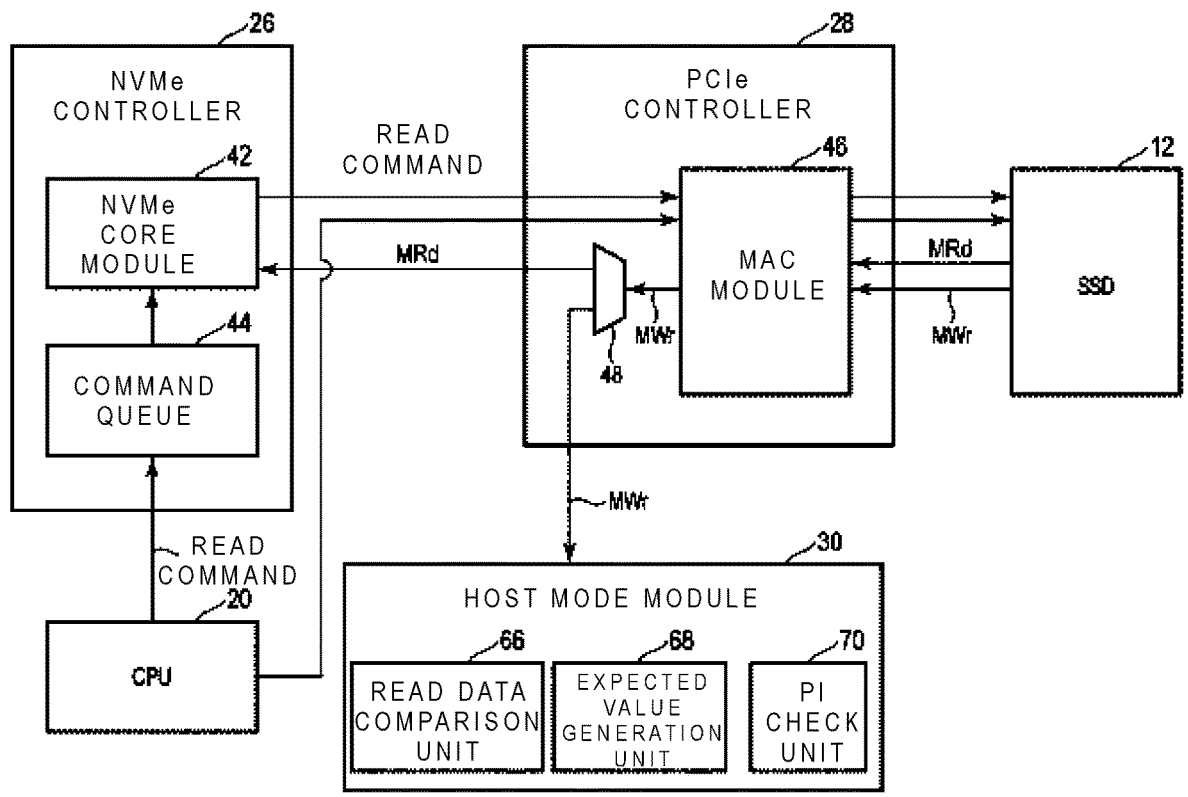
FIG. 5 is a diagram illustrating an example of read data comparison by the host mode module according to the first embodiment.

FIG. 5 is a diagram illustrating an example of read data comparison by the host mode module 30 according to the first embodiment.

The CPU 20 generates a read command requesting the SSD 12 to read data and writes the read command to the command queue 44. Further, the CPU 20 selects any one of the command 0 register group 72-0 to the command 31 register group 72-31 according to an operation that should be performed by the SSD 12 based on the read command. When a read data comparison function is enabled for the generated read command, the same values as those used for the write command requesting to write data that is requested to be read by the read command, are set in the one of the register groups selected by the CPU 20. The set value includes, for example, enable/disable value of PI check and a type of PI which is a target of the PI check.

The CPU 20 notifies the SSD 12 via the PCIe controller 28 that the command was written to the command queue 44. Upon receiving the notification, the SSD 12 transmits a memory read request MRd requesting to read the command from the command queue 44. The NVMe core module 42 receives the memory read request MRd via the PCIe controller 28. The NVMe core module 42 reads the read command from the command queue 44 and transmits the read command to the SSD 12 via the PCIe controller 28.

Upon receiving the read command, the SSD 12 transmits a memory write request MWr requesting to transmit read data. The MAC module 46 receives the memory write request MWr transmitted by the SSD 12 in response to the read command. The MAC module 46 transmits the memory write request MWr to the expected value generation unit 68, the read data comparison unit 66, and the PI check unit 70 of the host mode module 30 via the selection circuit 48.

The selection circuit 48 switches a transmission destination of the memory write request MWr between the host mode module 30 and the NVMe controller 26 according to the address waddr included in the memory write request MWr. When the address waddr corresponds to an address included in the transmitted read command, the selection circuit 48 sets the host mode module 30 as the transmission destination of the memory write request MWr. When the address waddr does not correspond to the address included in the transmitted read command, the selection circuit 48 sets the NVMe controller 26 as the transmission destination of the memory write request MWr.

The expected value generation unit 68 generates an expected value according to the address waddr included in the memory write request MWr, and transmits the expected value of the read data to the read data comparison unit 66 and the expected value of the PI to the PI check unit 70.

The host mode module 30 has a quadword counter for the number of commands for the SSD 12 to be queued at one time. One quadword (Q word) is 8 bytes. A value of each Q word counter is initialized based on the address raddr included in the memory read request MRd or the address waddr included in the memory write request MWr. The value of each Q word counter is incremented each time the write data generation unit 62 generates data for the Q word or each time the read data comparison unit 66 receives the data for the Q word.

Figure 6:
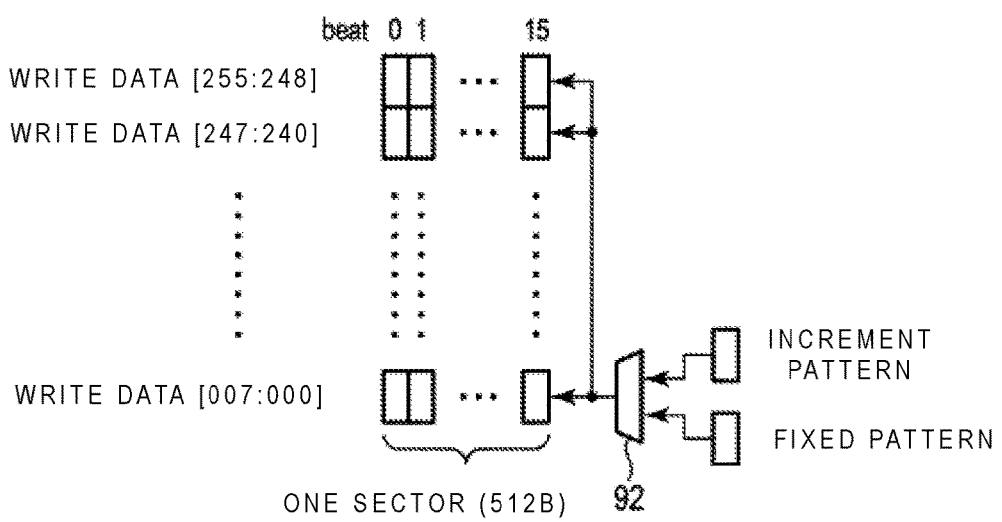
FIG. 6 is a diagram illustrating an example of an operation of a write data generation unit according to the first embodiment.

FIG. 6 is a diagram illustrating an example of an operation of the write data generation unit 62 according to the first embodiment. It is assumed that a length of the write data is one sector. A size of one sector (sector size) is, for example, 512 bytes (64 Q words). In the diagrams after FIG. 6, one beat indicates 4 Q words. In the example in FIG. 6, write data having an increment pattern or a fixed pattern is selected by a selection circuit 92.

The increment pattern is a data pattern in which a value regularly increases for each Q word. A value of data having the increment pattern changes according to a value of the Q word counter. The value of the data having the increment pattern may be a value obtained by multiplying the value of the Q word counter by a coefficient, or may be the value of the Q word counter itself. It should be noted that a decrement pattern may be selected instead of the increment pattern. The decrement pattern is a data pattern in which a value regularly decreases for each Q word.

The fixed pattern is a data pattern in which values of data of all Q words in one sector are fixed. A fixed value is set in a register FixPat (FIG. 13) that sets a fixed pattern in the register groups 72-0 to 72-31.

Figures 7, 8:
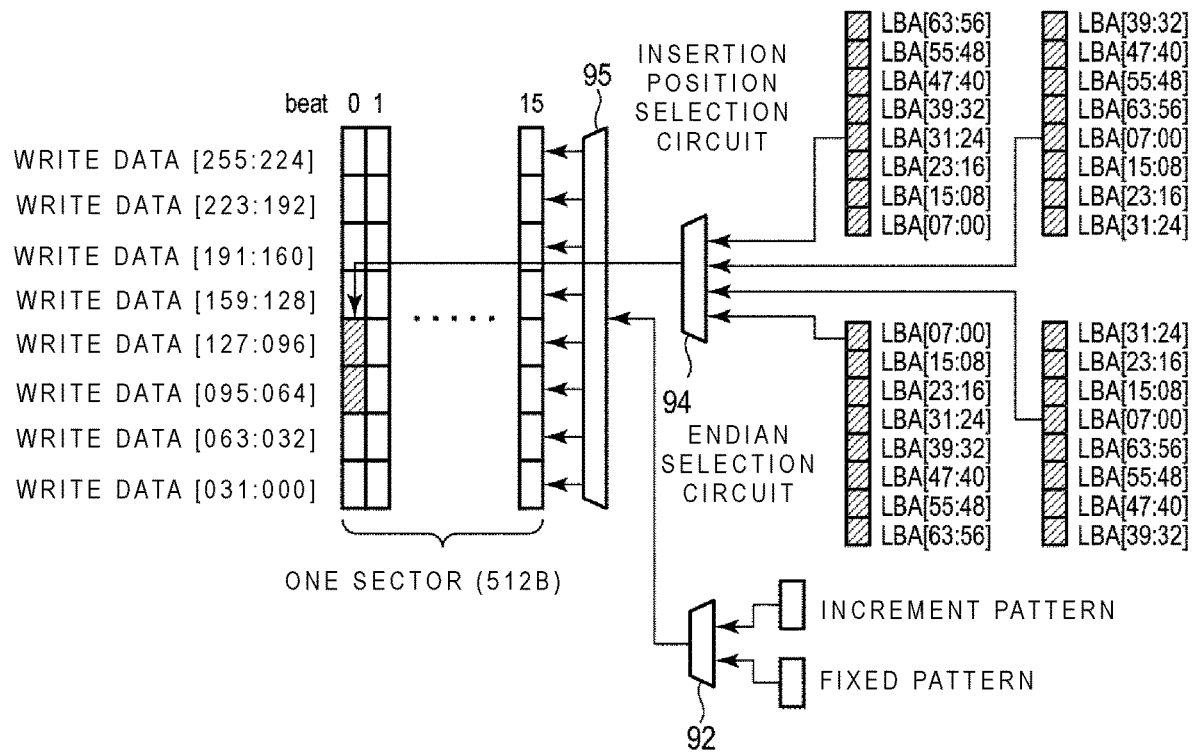
FIG. 7 is a diagram illustrating another example of the operation of the write data generation unit according to the first embodiment.
FIG. 8 is a diagram showing an example of a format of protection information (PI) according to the first embodiment.

FIG. 7 is a diagram illustrating another example of the operation of the write data generation unit 62 according to the first embodiment. In the example in FIG. 7, the write data having the increment pattern or the fixed pattern is selected by the selection circuit 92, and a part of the write data is replaced with data having an LBA pattern. The LBA pattern includes, for example, a logical address associated with the write data. In the write data, the LBA pattern can be inserted into any two doublewords according to a value of the address raddr in the memory read request MRd. One doubleword (D word) is 4 bytes.

A byte endian of the LBA pattern inside the D word can be changed by mode setting. Any one of a big endian LBA pattern, a little endian LBA pattern, and a middle endian LBA pattern is selected by a selection circuit 94, and the selected LBA pattern is inserted into the write data. In addition to an LBA pattern insertion position, the increment pattern or the fixed pattern selected by the selection circuit 92 is inserted into the write data. An insertion position of the increment pattern or the fixed pattern is selected by a selection circuit 95.

FIG. 8 is a diagram showing an example of a format of PI added to the write data by the PI addition unit 64 according to the first embodiment. The format of the PI includes three formats including a guard (GRD) (2 bytes), an application tag (APP) (2 bytes), and a reference tag (REF) (4 bytes). The PI addition unit 64 adds PI to the write data output from the write data generation unit 62. As shown in FIG. 8, the added PI is any one of the guard, the application tag and the reference tag, or any combination thereof. The guard includes the CRC code described above. The application tag is a tag having a different value for each command. A value of the application tag may be stored in any register in the register groups 72-0 to 72-31 corresponding to the command. The reference tag is a tag having a value corresponding to the LBA associated with the write data to which the PI is added.

Figure 9:
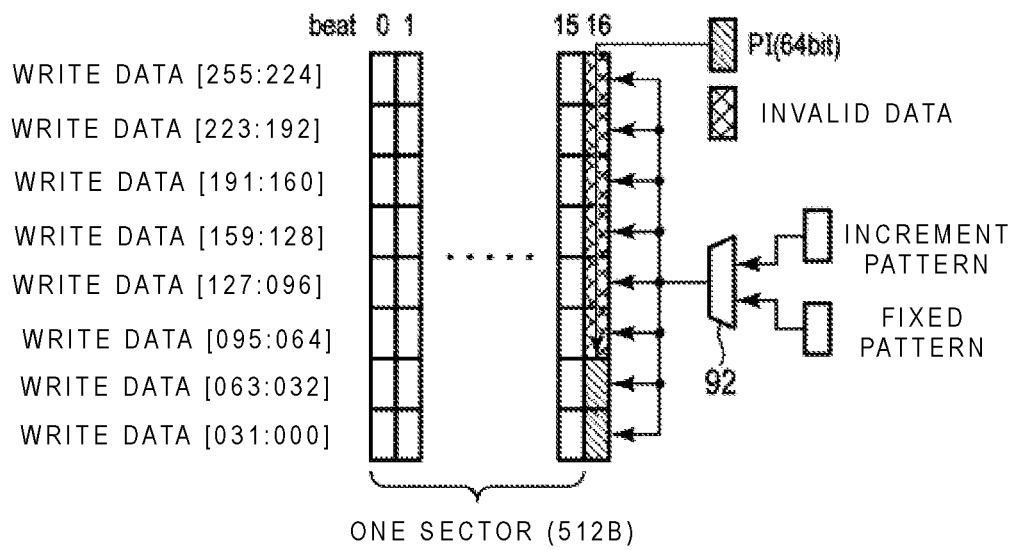
FIG. 9 is a diagram illustrating an example of an operation of a PI addition unit according to the first embodiment.

FIG. 9 is a diagram illustrating an example of an operation of the PI addition unit 64 according to the first embodiment. The PI addition unit 64 generates PI based on a data pattern of the write data. The PI addition unit 64 adds the PI at a position following the write data of one sector. The PI is added to, for example, a Q word after the last Q word of one sector, that is, the 65th Q word counting from the beginning of the sector when the sector size is 512 bytes.

Here, it is assumed that a data transfer size in the host mode module 30 is 256 bits (4 Q words). In this case, write data of one sector (512 bytes) is transferred in the host mode module 30 from beat 0 to beat 15. The PI is transferred in the host mode module 30 at beat 16. D words in a part of the beat 16 may be invalid data. FIG. 9 shows a case where the PI is 64 bits and the D words in a part of the beat 16 are invalid data.

When PI error injection is enabled, an error is inserted into the PI. The PI error injection can be enabled for each GRD, REF, and APP. For the PI that is a target of error injection, for example, all the bits thereof are inverted.

Figure 10:
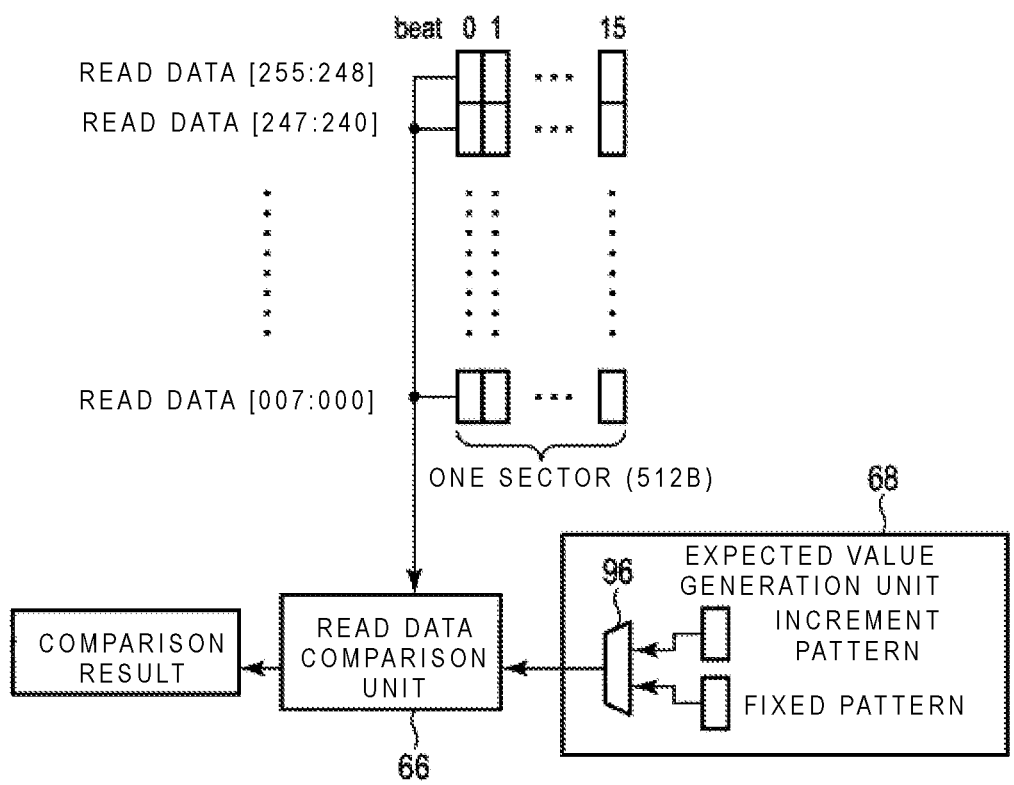
FIG. 10 is a diagram illustrating an example of an operation of a read data comparison unit according to the first embodiment.

FIG. 10 is a diagram illustrating an example of an operation of the read data comparison unit 66 according to the first embodiment. When the read data comparison function is enabled, the read data comparison unit 66 compares the expected value of the read data generated by the expected value generation unit 68 with the read data included in the memory write request MWr. In the example in FIG. 10, the expected value generation unit 68 selects either the increment pattern or the fixed pattern as the expected value by a selection circuit 96 and transmits the selected one to the read data comparison unit 66. In a fixed pattern mode, the read data comparison unit 66 compares a value of the read data with a value of a fixed pattern (FixPat) register (FIG. 13) that stores the fixed pattern. In an increment pattern mode, the read data comparison unit 66 compares the value of the read data with the data pattern in which a value regularly increases for each Q word.

Figure 11:
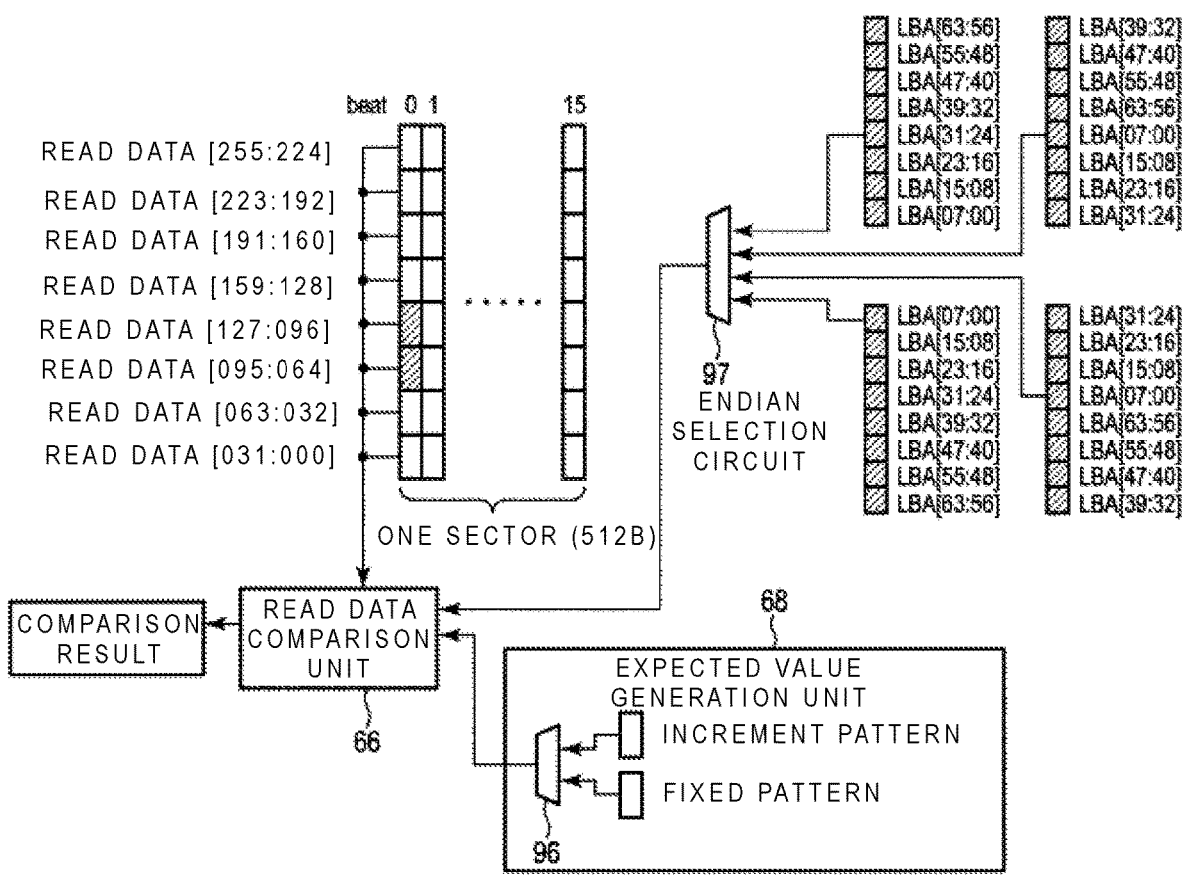
FIG. 11 is a diagram illustrating another example of the operation of the read data comparison unit according to the first embodiment.

FIG. 11 is a diagram illustrating another example of the operation of the read data comparison unit 66 according to the first embodiment. FIG. 11 illustrates an example in which the write data generation unit 62 inserts the LBA pattern into the write data. This write data is data generated in accordance with a write command that corresponds to a read command which is a target of data comparison. When the read data comparison function is enabled, the expected value of the read data into which the LBA pattern is inserted and which is generated by the expected value generation unit 68, and the read data included in the memory write request MWr are input to the read data comparison unit 66. The read data comparison unit 66 compares the read data with the expected value into which the LBA pattern is inserted. In the example in FIG. 11, the byte endian of the LBA pattern inside a D word is set by the mode setting to be equal to that during the time when the write data was generated (that is, when the write command was issued). A selection circuit 97 selects any one of a big endian LBA pattern, a little endian LBA pattern, and a middle endian LBA pattern according to the setting.

When the LBA pattern is inserted, an LBA pattern comparison position of the read data is selected according to the address waddr included in the memory write request MWr and a setting indicating into which D word in the Q word the LBA pattern is inserted.

Figure 12:
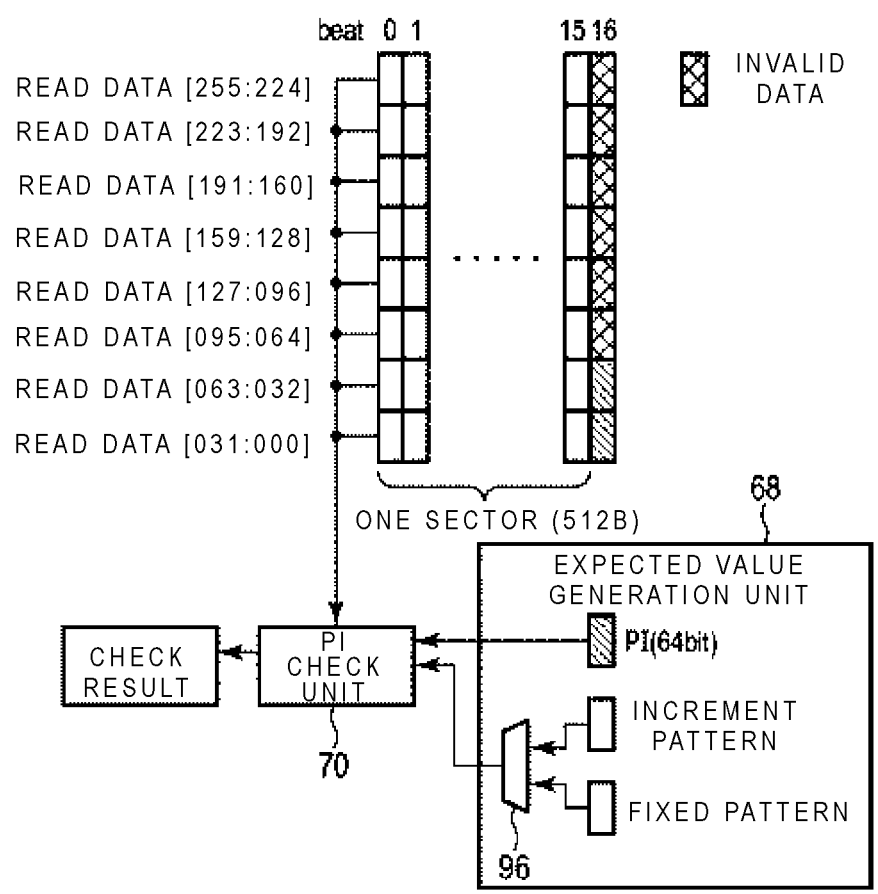
FIG. 12 is a diagram illustrating an example of an operation of a PI check unit according to the first embodiment.

FIG. 12 is a diagram illustrating an example of an operation of the PI check unit 70 according to the first embodiment. The PI check unit 70 executes the PI check. As described above with reference to FIG. 9, the data transfer size in the host mode module 30 is 256 bits (4 Q words). Read data of one sector (512 bytes) is transferred in the host mode module 30 from beat 0 to beat 15. The PI is transferred in the host mode module 30 at beat 16. When the D words in a part of the beat 16 are invalid data, the PI check unit 70 does not execute the PI check on the invalid data.

The expected value generation unit 68 generates PI based on a data pattern of the expected value of the read data. As described above with reference to FIG. 8, the generated PI is any one of the guard, the application tag and the reference tag, or any combination thereof. The expected value generation unit 68 generates PI having the same type as the PI generated for a write command corresponding to the read command, which is a target of the PI check.

The PI check unit 70 compares the PI received from the SSD 12 with the PI generated by the expected value generation unit 68.

Figure 13:
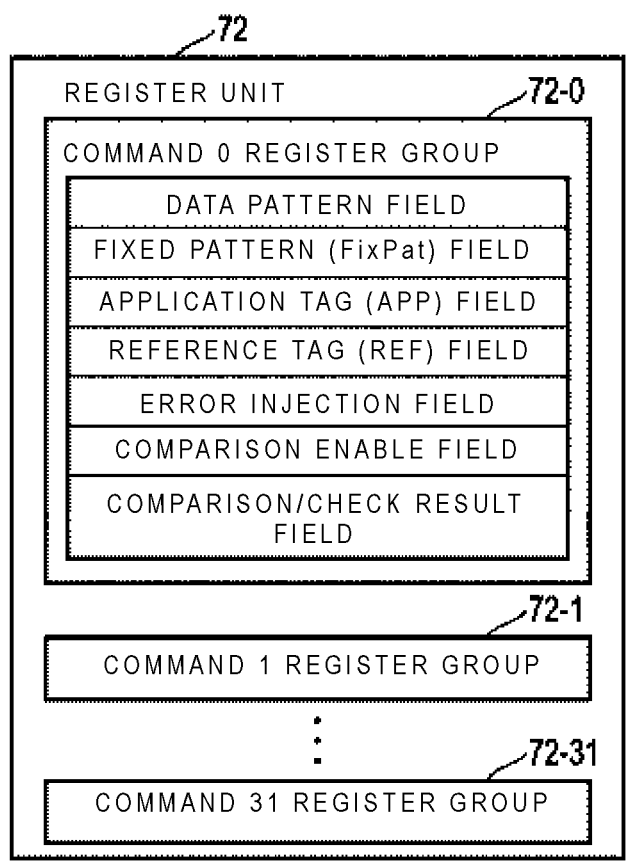
FIG. 13 is a diagram showing an example of a register of the host mode module according to the first embodiment.

FIG. 13 is a diagram showing an example of the register unit 72 of the host mode module 30 according to the first embodiment. Here, it is assumed that the number of the commands for the SSD 12 to be queued (queue depth) at one time is 32.

Each of the command 0 register group 72-0 to the command 31 register group 72-31 includes a data pattern field, a fixed pattern (FixPat) field, an application tag (APP) field, a reference tag (REF) field, an error injection field, a comparison enable field, and a comparison/check result field.

The following items are set in the data pattern field.
  Enable/disable value of the PI addition in the case of issuing a write command or enable/disable value of the PI check in the case of issuing a read command, and a type of the PI used at an enabled time
  Enable/disable value of LBA pattern insertion, an LBA insertion position at the enabled time, and an endian at the enabled time
  Enable/disable value of a fixed pattern mode.

A fixed pattern is set in the fixed pattern field. The fixed pattern is used when the fixed pattern mode is enabled in the data pattern field. The increment pattern is used when the fixed pattern mode is disabled (i.e., when the increment pattern mode is enabled) in the data pattern field.

An application tag is set in the application tag field. The application tag is used when the PI addition or the PI check is enabled and the application tag is enabled in the data pattern field.

An initial value of the reference tag is set in the reference tag field. The reference tag is used when the PI addition or the PI check is enabled and the reference tag is enabled in the data pattern field. The reference tag is incremented according to the LBA (that is, for each sector) from the initial value set in the reference tag field.

Enable/disable value of an error injection function to PI is set in the error injection field. The error injection field is used when the PI addition is enabled in the case of issuing a write command.

Enable/disable value of the read data comparison function is set in the comparison enable field. The comparison enable field is used in the case of issuing a read command.

The comparison result of the read data and the check result of the PI are stored in the comparison/check result field. The comparison/check result field is updated by the read data comparison unit 66 and the PI check unit 70 in response to reception, from the SSD 12, of the read data and the PI corresponding to the issued read command. The comparison/check result field includes information indicating a comparison/check result (that is, whether the received read data and the PI match the expected value) and an error detection position when the comparison/check result is an error.

Figures 14, 15A:
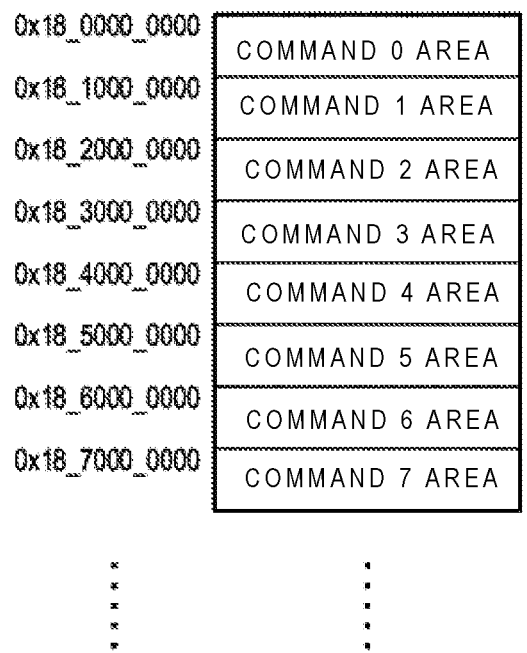

FIG. 14 is a diagram showing an example of a memory map of each of the register groups 72-0 to 72-31 of the register unit 72 according to the first embodiment. For example, a start address of a command 0 area for the command 0 register group 72-0 is 0x18_0000_0000, and a start address of a command 31 area for the command 31 register group 72-31 is 0x19_F000_0000. In the example in FIG. 14, a bit [32:28] of an address indicates a command number.

As described above, in the present embodiment, the semiconductor integrated circuit 1 includes the host mode module 30. The host mode module 30 is a module for the write data generation and the read data comparison. Therefore, the CPU 20 of the semiconductor integrated circuit 1 does not need to perform write data generation processing or read data comparison processing, a processing load of the CPU 20 is reduced, and a test time for the SSD 12 can be shortened. In addition, the host mode module 30 generates write data based on a setting during the test for the SSD 12, and transmits the write data to the SSD 12. Further, the host mode module 30 generates an expected value based on a setting during the test for the SSD 12, and compares the expected value with the read data received from the SSD 12. That is, the host mode module 30 generates and transmits the write data on-the-fly, receives the read data on-the-fly, and compares the read data with the expected value on-the-fly. In other words, the host mode module 30 does not store, in the DRAM 14, which is an example of a local memory device, at least a part of each of the write data for one sector, the read data for one sector, or the expected value for one sector. Therefore, since the write data or the expected value is not read from the DRAM 14 during the test for the SSD 12, high-speed DRAM access is unnecessary. Accordingly, a high-speed DRAM is unnecessary.

As shown in FIG. 14, the host mode module 30 includes the register groups 72-0 to 72-31. The register groups 72-0 to 72-31 are mapped to an address space divided for each command. The register groups 72-0 to 72-31 store set values for each command. Accordingly, the host mode module 30 can acquire a setting for a corresponding command from the register groups 72-0 to 72-31 based on the address waddr in the memory write request MWr or the address raddr in the memory read request MRd.

Even when the CPU 20 simultaneously queues a plurality of read commands for the SSD 12, the host mode module 30 can generate an expected value of the read data corresponding to each memory write request MWr based on the address waddr included in the memory write request MWr. Further, the host mode module 30 can compare the expected value with the read data included in the memory write request MWr based on the address waddr included in the memory write request MWr. Accordingly, the semiconductor integrated circuit 1 can test a plurality of read commands simultaneously.

Even when the CPU 20 simultaneously queues a plurality of write commands for the SSD 12, the host mode module 30 can generate the write data corresponding to each memory read request MRd based on the address raddr included in the memory read request MRd. Accordingly, the semiconductor integrated circuit 1 can test a plurality of write commands simultaneously.

Details of the write data generation processing and the read data comparison processing by the host mode module 30 according to the first embodiment will be described.

First, the write data generation processing will be described with reference to FIGS. 15A to 15D. Data transmitted and received between the test device 10 (more specifically, the PCIe controller 28 of the semiconductor integrated circuit 1) and the SSD 12 is divided into units defined by the PCIe standard. The divided data is transmitted and received as packets. In the PCIe standard, the maximum size (packet size) of data to be transferred in one packet as a memory write request MWr is defined as a max payload size (MPS). Further, in the PCIe standard, the maximum size of data to be transferred in one packet in response to a memory read request MRd is defined as a max read request size (MRRS). In the following description, the MPS and the MRRS are 512 bytes.

The memory read request MRd from the SSD 12 is transmitted from the PCIe controller 28 to the host mode module 30. The host mode module 30 determines, based on the address raddr in the memory read request MRd, which command the request is related to and data of which Q word of which sector the request is related to, and generates write data and PI as shown in FIGS. 6 to 9.

When the sector size is 512 bytes, a total size of the write data and the PI is 520 bytes. The total size is larger than the MRRS. Therefore, the write data of one sector and the PI cannot be transferred in one packet. Therefore, the write data of one sector may be transferred in a plurality of packets. Note that the transfer size and the sector size are not limited to the above examples, and various values may be taken.

In a case where a test device in the related art tests the SSD 12, when the memory read request MRd is issued from the SSD 12, the test device obtains write data stored in a physical memory in TLP packet units whose size is defined by the MRRS, and transfers the write data as packets to the SSD 12.

The host mode module 30 in the embodiment does not include a physical memory that stores write data in order to reduce a memory amount and a memory bandwidth. The host mode module 30 determines whether the Q word is the write data or the PI based on the Q word counter. That is, the host mode module 30 generates the write data and the PI based on the address raddr included in the memory read request MRd. Since the determination is based on the Q word counter, a case where the SSD 12 requests a packet that divides the data in units other than the MPS and the MRRS can also be dealt with.

FIGS. 15A to 15D are diagrams illustrating an example of the write data generated by the host mode module 30. Here, it is assumed that the SSD 12 transmits a memory read request MRd specifying an address raddr 0x0000. FIG. 15A shows an initial packet generated by the host mode module 30 in response to this memory read request MRd.

One cell in FIGS. 15A to 15D indicates one Q word (8 bytes). A bus width in the host mode module 30 is 256 bits (32 bytes), and the host mode module 30 transfers four Q words in one clock cycle (beat). In FIGS. 15A to 15D, a Q word in a row RD0 corresponds to data of bit [63:0], a Q word in a row RD1 corresponds to data of bit [127:64], a Q word in a row RD2 corresponds to data of bit [191:128], and a Q word in a row RD3 corresponds to data of bit [255:192].

The host mode module 30 sets an initial value of a Q word counter based on the address raddr. FIG. 16 is a diagram illustrating processing of setting the initial value of the Q word counter by the host mode module 30 based on the address raddr.

When a bit [4:0] of the address raddr is not 0, that is, when at least one bit of the bit [4:0] is 1 (#1), the host mode module 30 sets the Q word counter to a value obtained by subtracting a value of a bit [4:3] of the address raddr from 0 (i.e., 0-raddr [4:3]). When a remainder obtained by dividing the value of the address raddr by the sector size is 0 (#2), the host mode module 30 sets the Q word counter to 0. It should be noted that the sector size here includes the PI. For example, when PI of 8 bytes is added to write data of 512 bytes per sector, the sector size is 520 bytes. In a case other than #1 and #2, i.e., case #3, the host mode module 30 maintains the value of the Q word counter at a previous value.

The memory read request MRd also includes information for specifying the transfer size in addition to information for specifying the address raddr. Here, it is assumed that the memory read request MRd transmitted by the SSD 12 specifies the address raddr as 0x0000 and specifies the transfer size as 512 bytes. The first packet (512 bytes) generated by the host mode module 30 in response to the memory read request MRd includes write data of a first sector (Q word counter=0 to 63), but does not include PI (Q word counter=64).

Since the address raddr in the memory read request MRd is 0x0000, condition #2 is satisfied. Thus, the host mode module 30 sets the initial value of the Q word counter to 0. As shown in FIG. 15A, the host mode module 30 generates the first packet of 512 bytes including a first Q word (the value of the Q word counter is 0) to a 64th Q word (the value of the Q word counter is 63) of the first sector. When the data pattern field is set to the fixed pattern mode, values of data of all Q words are the same value specified by the fixed pattern (FixPat) register. When the data pattern field is set to the increment pattern mode (i.e., when the fixed pattern mode is disabled), a value of data of a Q word may be, for example, the value of the Q word counter or a value obtained by multiplying the value of the Q word counter by a coefficient.

Next, to request the 65th Q word (PI) of the first sector that is not included in the first packet, the SSD 12 transmits a memory read request MRd specifying an address raddr 0x0200 and specifying a transfer size of 32 bytes. FIG. 15B shows the second packet generated by the host mode module 30 in response to this memory read request MRd.

Since the address raddr in the memory read request MRd is 0x0200, condition #3 shown in FIG. 16 is satisfied. Thus, the host mode module 30 sets the initial value of the Q word counter to the same value as the previous value. Since the value of the Q word counter is 64 due to output of the last four Q words in the first packet, the initial value of the Q word counter remains 64. As shown in FIG. 15B, the host mode module 30 generates the second packet of 32 bytes including the 65th Q word (the value of the Q word counter is 64 and it includes PI) of the first sector, and the first Q word (the value of the Q word counter is 0) to the third Q word (the value of the Q word counter is 2) of the second sector. It should be noted that since the SSD 12 does not require the first Q word to the third Q word of the second sector in the second packet, the first Q word to the third Q word may be discarded. It should be noted that the SSD 12 only requires the 65th Q word (PI) of the first sector, but since four Q words are the minimum unit of data transfer in the host mode module 30, the host mode module 30 generates the 65th Q word of the first sector and the first Q word to the third Q word of the second sector together.

Next, to request the second sector, the SSD 12 transmits a memory read request MRd specifying an address raddr 0x0208 and specifying a size of 512 bytes. FIG. 15C shows the third packet generated by the host mode module 30 in response to this memory read request MRd.

Since the address raddr in the memory read request MRd is 0x0208 (=0010_0000_1000), condition #1 shown in FIG. 16 is satisfied. Thus, the host mode module 30 sets the Q word counter to a value obtained by subtracting the value of the bit [4:3] of the address raddr from 0 (i.e., −1). A value of the Q word counter of a Q word corresponding to RD0 of beat 0 is −1. A value of the Q word counter of a Q word (hatched portion in the figure) corresponding to RD1 of beat 0 is incremented by one, i.e., 0. This Q word corresponds to the initial byte of the second sector requested at the address raddr 0x0208. As shown in FIG. 15C, the host mode module 30 generates the third packet of 512 bytes including the Q word having the value of the Q word counter of −1, and the first Q word (the value of the Q word counter is 0) to the 63rd Q word (the value of the Q word counter is 62) of the second sector. Since the SSD 12 does not require the Q word having the value of the Q word counter of −1, a value of data of this Q word may be any value. The SSD 12 may discard the data of this Q word.

The third packet shown in FIG. 15C does not include a part of the Q words of the second sector, specifically the 64th Q word (the value of the Q word counter is 63) and the 65th Q word (PI) (the value of the Q word counter is 64) of the second sector.

Next, to request the 64th Q word and the 65th Q word (PI) of the second sector, which are not included in the third packet, and the third sector, the SSD 12 transmits a memory read request MRd specifying an address raddr 0x0400 and specifying a size of 512 bytes. FIG. 15D shows the fourth packet generated by the host mode module 30 in response to this memory read request MRd.

Since the address raddr in the memory read request MRd is 0x0400, condition #3 shown in FIG. 16 is satisfied. Thus, the host mode module 30 sets the initial value of the Q word counter to the same value as the previous value. Since the value of the Q word counter is 63 due to output of the last four Q words in the third packet, the initial value of the Q word counter remains 63. As shown in FIG. 15D, the host mode module 30 generates the third packet of 512 bytes including the 64th Q word (the value of the Q word counter is 63) and the 65th Q word (PI) (the value of the Q word counter is 64) of the second sector, and the first Q word (the value of the Q word counter is 0) to the 62nd Q word (the value of the Q word counter is 61) of the third sector.

Figures 17C, 18:
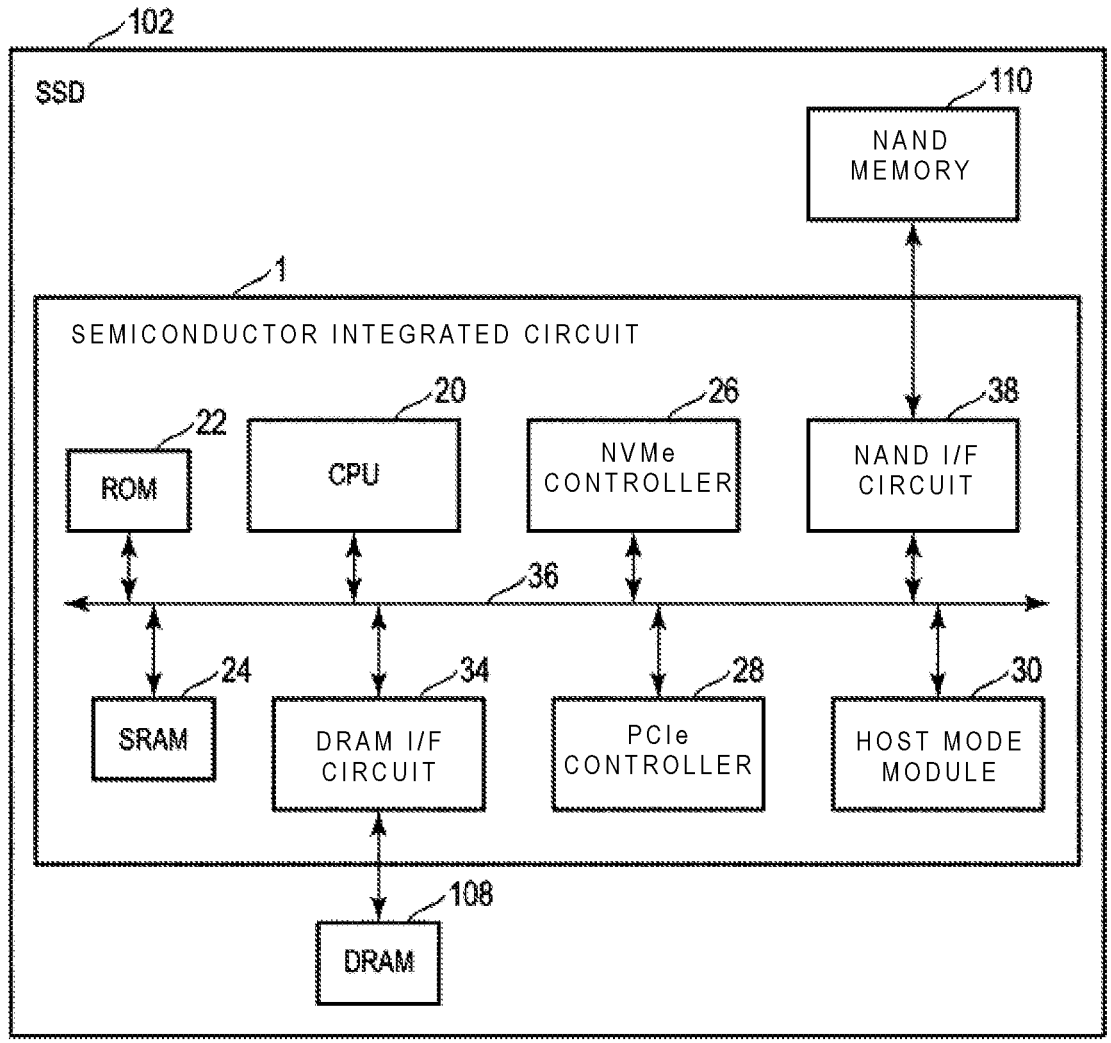

FIGS. 17A to 17C are diagrams illustrating another example of the write data generated by the host mode module 30. FIGS. 17A to 17C show an example in which transfer sizes specified by a memory read request MRd issued by the SSD 12 are all 512 bytes.

FIG. 17A shows an initial packet generated by the host mode module 30 in response to a memory read request MRd specifying an address raddr 0x0000 when the SSD 12 transmits the memory read request MRd.

Since the address raddr in the memory read request MRd is 0x0000, condition #2 shown in FIG. 16 is satisfied. Thus, the host mode module 30 sets the initial value of the Q word counter to 0. As shown in FIG. 17A, the host mode module 30 generates the first packet of 512 bytes including the first Q word (the value of the Q word counter is 0) to the 64th Q word (the value of the Q word counter is 63) of the first sector.

Next, to request the 65th Q word (the value of the Q word counter is 64 and it includes PI) of the first sector, which is not included in the first packet, and the second sector, the SSD 12 issues a memory read request MRd specifying an address raddr 0x0200. FIG. 17B shows the second packet generated by the host mode module 30 in response to this memory read request MRd.

Since the address raddr in the memory read request MRd is 0x0200, condition #3 shown in FIG. 16 is satisfied. Thus, the host mode module 30 sets the initial value of the Q word counter to the same value as the previous value. Since the value of the Q word counter is 64 due to output of the last four Q words in the first packet, the initial value of the Q word counter remains 64. The value of the Q word counter of the first Q word (Q word corresponding to RD1 of beat 0) of the second sector is 0. As shown in FIG. 17B, the host mode module 30 generates the second packet of 512 bytes including the 65th Q word (PI) of the first sector having the value of the Q word counter of 64, and the first Q word (the value of the Q word counter is 0) to the 63rd Q word (the value of the Q word counter is 62) of the second sector.

The second packet shown in FIG. 17B does not include a part of the Q words of the second sector, specifically the 64th Q word (the value of the Q word counter is 63) and the 65th Q word (the value of the Q word counter is 64 and it includes PI) of the second sector.

Next, to request the 64th Q word and the 65th Q word (PI) of the second sector, which are not included in the second packet, and the third sector, the SSD 12 issues a memory read request MRd specifying an address raddr 0x0400. FIG. 17C shows the third packet generated by the host mode module 30 in response to this memory read request MRd.

Since the address raddr in the memory read request MRd is 0x0400, condition #3 shown in FIG. 16 is satisfied. Thus, the host mode module 30 sets the initial value of the Q word counter to the same value as the previous value. Since the value of the Q word counter is 63 due to output of the last four Q words in the second packet, the initial value of the Q word counter remains 63. As shown in FIG. 17C, the host mode module 30 generates the third packet of 512 bytes including the 64th Q word (the value of the Q word counter is 63) and the 65th Q word (the value of the Q word counter is 64 and it includes PI) of the second sector, and the first Q word (the value of the Q word counter is 0) to the 62nd Q word (the value of the Q word counter is 61) of the third sector.

In this way, the host mode module 30 can determine which one of the three conditions #1, #2, and #3 is satisfied according to the address in the memory read request MRd, and accordingly determine from which Q word in which sector data of one packet is to be generated. As a result, even when the transfer size of the packet and the sector size of the write data are different, the packet can be generated according to the memory read request MRd.

The host mode module 30 also generates the expected value of the read data in the read data comparison processing as well as in the write data generation processing. The memory write request MWr from the SSD 12 is transmitted from the PCIe controller 28 to the host mode module 30. The host mode module 30 determines, based on the address waddr in the memory write request MWr, which command the request is related to and data of which Q word of which sector the request is related to. Then, the host mode module 30 compares the read data included in the memory write request MWr with the expected value thereof, and executes the PI check.

For example, it is assumed that the SSD 12 issues a memory write request MWr specifying an address waddr 0x0000 and specifying a transfer size of 512 bytes. The memory write request MWr includes the first packet including read data of 512 bytes, similar to that shown in FIG. 15A.

The expected value generation unit 68 of the host mode module 30 generates an expected value of the read data. The expected value generation unit 68 determines an address waddr in the memory write request MWr according to the conditions shown in FIG. 16, and generates an expected value according to the determination result. Since the address waddr in the memory write request MWr is 0x0000, condition #2 is satisfied. Thus, the expected value generation unit 68 sets the initial value of the Q word counter to 0 and generates, similar to that shown in FIG. 15A, an expected value of 512 bytes including the first Q word (the value of the Q word counter is 0) to the 64th Q word (the value of the Q word counter is 63) of the first sector.

When the data pattern field is set to the fixed pattern mode, expected values of all Q words of the read data are the same value specified by the fixed pattern (FixPat) register. When the data pattern field is set to the increment pattern mode, an expected value of each Q word of the read data may be, for example, the value of the Q word counter or a value obtained by multiplying the value of the Q word counter by a coefficient.

Next, it is assumed that the SSD 12 transmits a memory write request MWr specifying an address waddr 0x0200 and specifying a transfer size of 32 bytes. The memory write request MWr includes the second packet including read data of 32 bytes, similar to that shown in FIG. 15B.

The expected value generation unit 68 determines an address waddr in the memory write request MWr according to the conditions shown in FIG. 16, and generates an expected value according to the determination result. Since the address waddr in the memory write request MWr is 0x0200, condition #3 is satisfied. Thus, the expected value generation unit 68 sets the initial value of the Q word counter to the same value as the previous value. Since the value of the Q word counter is 64 due to reception of the last four Q words of the read data in the first packet, the initial value of the Q word counter remains 64. The expected value generation unit 68 generates, similar to that shown in FIG. 15B, an expected value of 32 bytes including the 65th Q word (the value of the Q word counter is 64 and it includes PI) of the first sector, and the first Q word (the value of the Q word counter is 0) to the third Q word (the value of the Q word counter is 2) of the second sector. It should be noted that the read data comparison unit 66 excludes, from the comparison target, the first Q word to the third Q word of the second sector included in the second packet.

Next, it is assumed that the SSD 12 issues a memory write request MWr specifying an address waddr 0x0208 and specifying a transfer size of 512 bytes. The memory write request MWr includes the third packet including read data of 512 bytes, similar to that shown in FIG. 15C.

The expected value generation unit 68 determines an address waddr in the memory write request MWr according to the conditions shown in FIG. 16, and generates an expected value according to the determination result. Since the address waddr of the memory write request MWr is 0x0208, condition #1 is satisfied. Thus, the expected value generation unit 68 sets the initial value of the Q word counter to a value obtained by subtracting the value of the bit [4:3] of the address waddr from 0 (i.e., −1). The expected value generation unit 68 generates, similar to that shown in FIG. 15C, an expected value of 512 bytes including the Q word having the value of the Q word counter of −1, the first Q word (the value of the Q word counter is 0) to the 63rd Q word (the value of the Q word counter is 62) of the second sector. It should be noted that the read data comparison unit 66 excludes, from the comparison target, the Q word having the value of the Q word counter of −1.

Next, it is assumed that the SSD 12 issues a memory write request MWr specifying an address waddr 0x0400 and specifying a transfer size of 512 bytes. The memory write request MWr includes the fourth packet including read data of 512 bytes, similar to that shown in FIG. 15D.

The expected value generation unit 68 determines an address waddr in the memory write request MWr according to the conditions shown in FIG. 16, and generates an expected value according to the determination result. Since the address waddr in the memory write request MWr is 0x0400, condition #3 is satisfied. Thus, the expected value generation unit 68 maintains the initial value of the Q word counter at the same value as the previous value. Since the value of the Q word counter is 63 due to reception of the last four Q words in the third packet, the initial value of the Q word counter is 63. The expected value generation unit 68 generates, similar to that shown in FIG. 15D, an expected value of 512 bytes including the 64th Q word (the value of the Q word counter is 63) and the 65th Q word (the value of the Q word counter is 64 and it includes PI) of the second sector, and the first Q word (the value of the Q word counter is 0) to the 62nd Q word (the value of the Q word counter is 61) of the third sector.

In this way, the expected value generation unit 68 determines which one of the three conditions including #1, #2, and #3 is satisfied according to the address of the memory write request MWr, and accordingly determines which Q word in which sector is the comparison target. As a result, even when the transfer size of the packet and the sector size of the read data are different, the expected value can be generated according to the memory write request MWr.

Second Embodiment

FIG. 18 is a block diagram showing an example of an SSD including a semiconductor integrated circuit according to a second embodiment. The second embodiment relates to an SSD capable of self-test by using the semiconductor integrated circuit 1 described in the first embodiment as an SSD controller. That is, the semiconductor integrated circuit 1 according to the first embodiment operates in a host mode, while the semiconductor integrated circuit 1 according to the second embodiment operates in a drive mode. The host mode and the drive mode are switched, for example, according to a value of a register provided in the host mode module 30. In the following description, an operation different from the operation of the semiconductor integrated circuit 1 in the first embodiment is an operation when the semiconductor integrated circuit 1 is in the drive mode.

An SSD 102 according to the second embodiment includes a NAND memory 110, the semiconductor integrated circuit 1, and a DRAM 108. The semiconductor integrated circuit 1 is electrically connected to the NAND memory 110 and the DRAM 108. The DRAM 108 may be provided in the semiconductor integrated circuit 1. The SSD 102 can be connected to a host via the PCIe controller 28 of the semiconductor integrated circuit 1.

Figure 19:
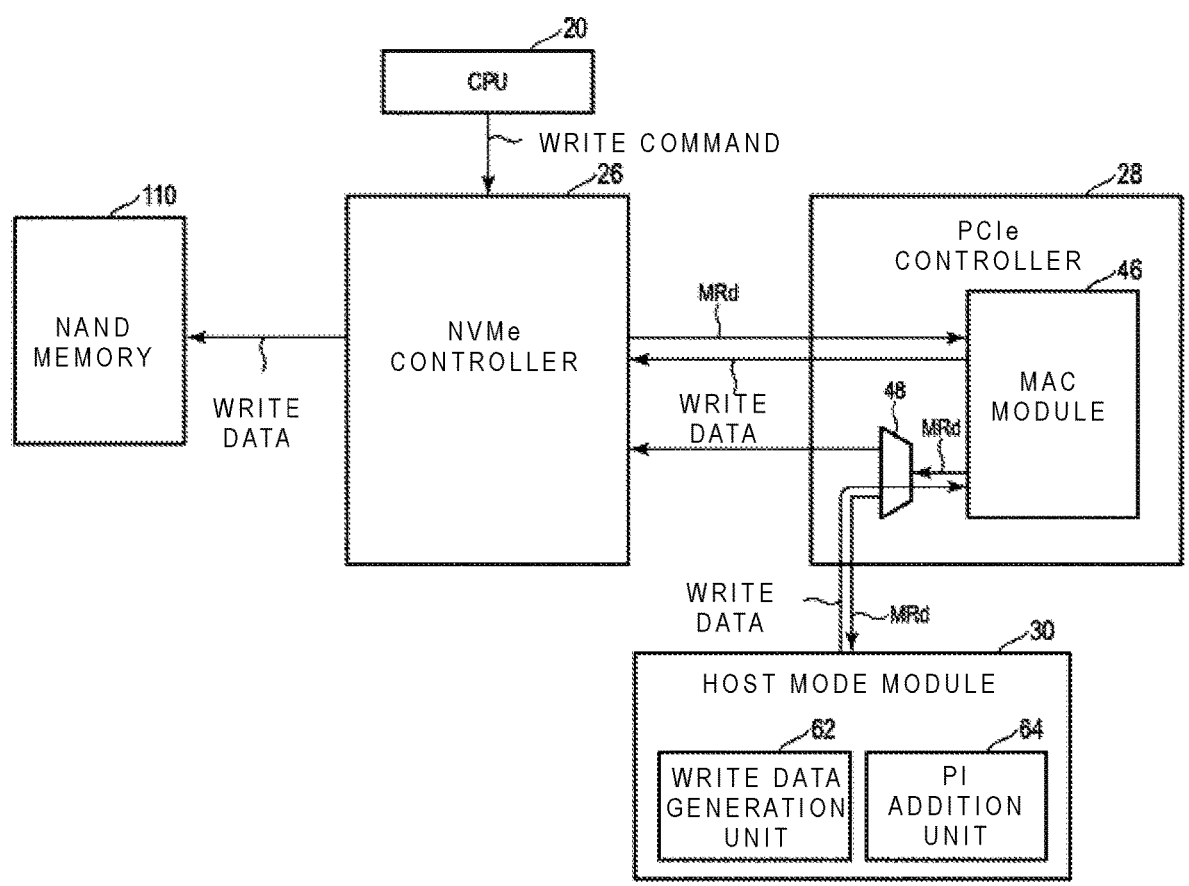
FIG. 19 is a diagram showing an example of emulation relating to a write command in the SSD according to the second embodiment.

FIG. 19 is a diagram illustrating an example of an operation of emulating that the SSD 102 according to the second embodiment receives a write command from the host. FIG. 19 relates to write data generation processing.

The CPU 20 generates a write command as in the first embodiment, and transmits the write command to the NVMe controller 26. The NVMe controller 26 issues a memory read request MRd in response to the write command. The MAC module 46 of the PCIe controller 28 transmits the memory read request MRd to the selection circuit 48. The selection circuit 48 transmits the memory read request MRd to the host mode module 30 when the memory read request MRd includes an address of the write command. The host mode module 30 generates write data as in the first embodiment.

The host mode module 30 transmits the generated write data to the PCIe controller 28. The PCIe controller 28 transmits the write data to the NVMe controller 26. The NVMe controller 26 transmits the write data to the NAND memory 110 via the NAND I/F circuit 38. Accordingly, the write data generated by the host mode module 30 in response to the memory read request MRd is written to the NAND memory 110.

Figure 20:
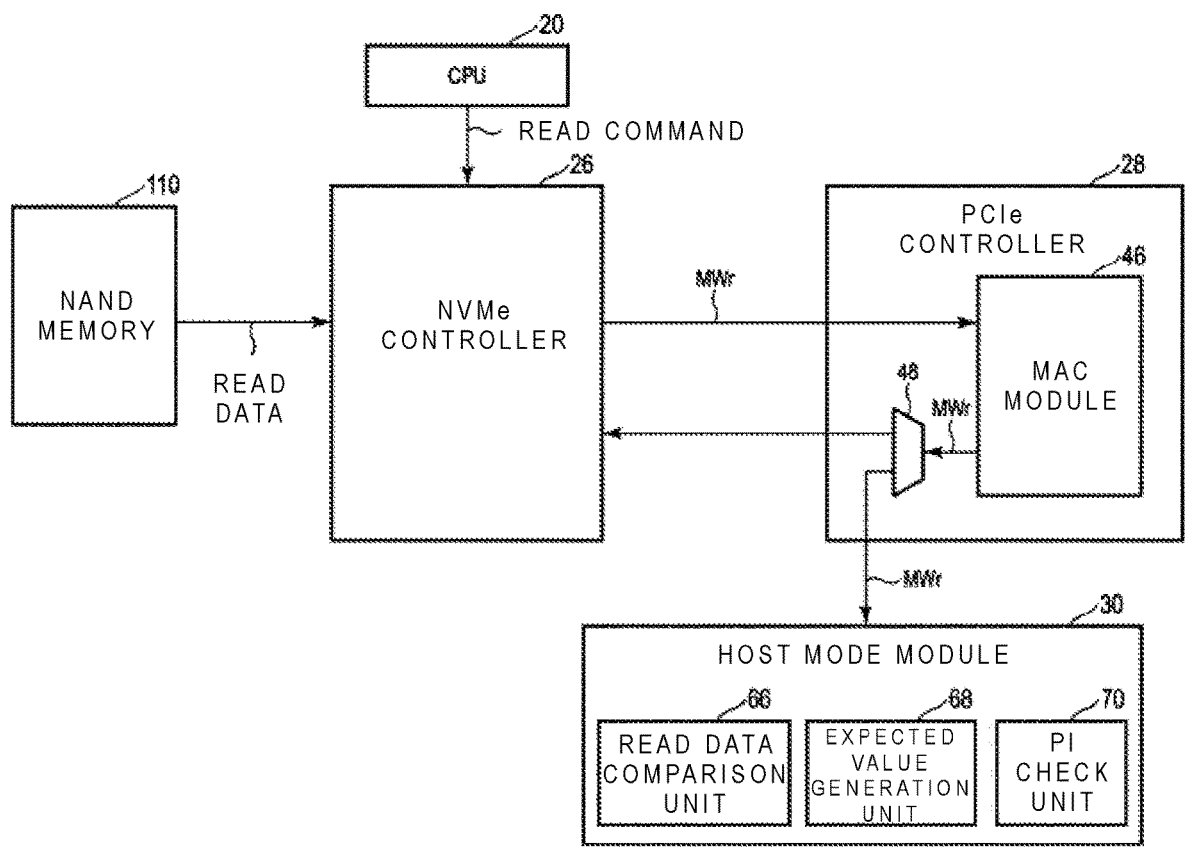
FIG. 20 is a diagram showing an example of emulation relating to a read command in the SSD according to the second embodiment.

FIG. 20 is a diagram illustrating an example of an operation of emulating that the SSD 102 according to the second embodiment receives a read command from the host. FIG. 20 relates to read data comparison processing.

The CPU 20 generates a read command as in the first embodiment, and transmits the read command to the NVMe controller 26. The NVMe controller 26 reads read data from the NAND memory 110 in response to the read command. The NVMe controller 26 transmits the read data to the PCIe controller 28 as a memory write request MWr. The MAC module 46 of the PCIe controller 28 transmits the memory write request MWr to the selection circuit 48. The selection circuit 48 transmits the memory write request MWr to the host mode module 30 when the memory write request MWr includes an address of the read command.

Similar to the first embodiment, the expected value generation unit 68 of the host mode module 30 generates an expected value based on an address waddr included in the memory write request MWr, and transmits the expected value to the read data comparison unit 66 and the PI check unit 70.

Upon receiving the memory write request MWr, the read data comparison unit 66 compares the expected value with the read data included in the memory write request MWr.

When the read data is correctly read from the NAND memory 110, the read data matches the expected value. The PI check unit 70 checks an error in the read data based on PI in the read data and PI generated by the expected value generation unit 68.

In this way, even when the SSD 102 is not connected to the host, the SSD 102 using the semiconductor integrated circuit 1 according to the second embodiment as a controller can emulate an operation and perform a self-test for receiving a read command or a write command.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
a write test circuit configured to generate test data and transmit the generated test data to an external memory device without storing the generated test data in a local memory device; and
a read test circuit configured to receive from the external memory device, read data that the external memory device has obtained by reading the generated test data, and compare the received read data with an expected value without storing either the received read data or the expected value in the local memory device, wherein
the write test circuit generates the test data according to a physical address of the local memory device, specified in a write command, and
the read test circuit is further configured to generate the expected value according to a physical address of the local memory device, specified in a read command.

2. The semiconductor integrated circuit according to claim 1, wherein the write test circuit generates the test data also in accordance with a logical address specified in the write command, and the read test circuit generates the expected value also in accordance with a logical address specified in the read command.

3. The semiconductor integrated circuit according to claim 1, wherein the write test circuit transmits, in response to a reception of a first packet transmitted by the external memory device in response to the write command, the generated test data to the external memory device by using a second packet.

4. The semiconductor integrated circuit according to claim 3, wherein
the generated test data includes a plurality of data items,
the first packet includes a transfer size and a first address corresponding to a location in the local memory device, of the semiconductor integrated circuit, and
the write test circuit sequentially generates, in response to the reception of the first packet including the first address, the plurality of data items such that the plurality of data items corresponds to an address range that begins at the first address and is dependent on the transfer size.

5. The semiconductor integrated circuit according to claim 4, wherein the write test circuit applies a data pattern to generate each of the plurality of data items included in the test data.

6. The semiconductor integrated circuit according to claim 5, wherein the data pattern is an incrementing pattern in which for each of the plurality of data items, the data item has a value greater than a value of any data item with a lower address.

7. The semiconductor integrated circuit according to claim 5, wherein the data pattern is a fixed pattern in which a value of each of the plurality of data items is fixed.

8. The semiconductor integrated circuit according to claim 3, wherein the read test circuit generates the expected value and performs the comparison of the received read data with the expected value, in response to a reception of a third packet transmitted by the external memory device in response to the read command.

9. The semiconductor integrated circuit according to claim 8, wherein
the generated test data includes a plurality of data items,
the third packet includes a transfer size and a second address corresponding to a location in the local memory device, of the semiconductor integrated circuit, and
the read test circuit sequentially generates, in response to the reception of the third packet including the second address, a plurality of expected values corresponding to an address range that begins at the second address and is dependent on the transfer size.

10. A memory system comprising:
the semiconductor integrated circuit according to claim 1; and
a nonvolatile memory electrically connected to the semiconductor integrated circuit, wherein the nonvolatile memory is the external memory device.

11. A semiconductor integrated circuit comprising:
a write test circuit configured to generate test data and transmit the generated test data to an external memory device without storing the generated test data in a local memory device; and
a read test circuit configured to receive from the external memory device, read data that the external memory device has obtained by reading the generated test data, and compare the received read data with an expected value without storing either the received read data or the expected value in the local memory device, wherein
the write test circuit transmits, in response to a reception of a first packet transmitted by the external memory device in response to a write command, the generated test data to the external memory device by using a second packet,
the generated test data includes a plurality of data items,
the first packet includes a transfer size and a first address corresponding to a location in the local memory device, of the semiconductor integrated circuit, and
the write test circuit sequentially generates, in response to the reception of the first packet including the first address, the plurality of data items such that the plurality of data items corresponds to an address range that begins at the first address and is dependent on the transfer size.

12. The semiconductor integrated circuit according to claim 11, wherein
the write test circuit generates the test data according to a physical address of the local memory device, specified in the write command, and also in accordance with a logical address specified in the write command, and
the read test circuit is further configured to generate the expected value according to a physical address of the local memory device, specified in a read command, and also in accordance with a logical address specified in the read command.

13. The semiconductor integrated circuit according to claim 11, wherein
the write test circuit applies a data pattern to generate each of the plurality of data items included in the generated test data, and
the data pattern is an incrementing pattern in which for each of the plurality of data items, the data item has a value greater than a value of any data item with a lower address.

14. The semiconductor integrated circuit according to claim 11, wherein the read test circuit is further configured to generate the expected value, and performs the comparison of the received read data with the expected value, in response to a reception of a third packet transmitted by the external memory device in response to a read command.

15. A memory system comprising:
the semiconductor integrated circuit according to claim 11; and
a nonvolatile memory electrically connected to the semiconductor integrated circuit, wherein the nonvolatile memory is the external memory device.

16. A semiconductor integrated circuit comprising:
a write test circuit configured to generate test data and transmit the generated test data to an external memory device without storing the generated test data in a local memory device; and
a read test circuit configured to receive from the external memory device, read data that the external memory device has obtained by reading the generated test data, and compare the received read data with an expected value without storing either the received read data or the expected value in the local memory device, wherein
the write test circuit transmits, in response to a reception of a first packet transmitted by the external memory device in response to a write command, the generated test data to the external memory device by using a second packet, and
the read test circuit generates the expected value and performs the comparison of the received read data with the expected value, in response to a reception of a third packet transmitted by the external memory device in response to a read command.

17. The semiconductor integrated circuit according to claim 16, wherein
the write test circuit generates the test data according to a physical address of the local memory device, specified in the write command, and also in accordance with a logical address specified in the write command, and
the read test circuit is further configured to generate the expected value according to a physical address of the local memory device, specified in the read command, and also in accordance with a logical address specified in the read command.

18. The semiconductor integrated circuit according to claim 16, wherein
the generated test data includes a plurality of data items,
the first packet includes a transfer size and a first address corresponding to a location in the local memory device, of the semiconductor integrated circuit,
the write test circuit sequentially generates, in response to the reception of the first packet including the first address, the plurality of data items such that the plurality of data items corresponds to an address range that begins at the first address and is dependent on the transfer size, the write test circuit applies a data pattern to generate each of the plurality of data items included in the generated test data, and the data pattern is an incrementing pattern in which for each of the plurality of data items, the data item has a value greater than a value of any data item with a lower address.

19. The semiconductor integrated circuit according to claim 16, wherein the generated test data includes a plurality of data items, the third packet includes a transfer size and a second address corresponding to a location in the local memory device, of the semiconductor integrated circuit, and the read test circuit sequentially generates, in response to the reception of the third packet including the second address, a plurality of expected values corresponding to an address range that begins at the second address and is dependent on the transfer size.

20. A memory system comprising:

the semiconductor integrated circuit according to claim 16; and a nonvolatile memory electrically connected to the semiconductor integrated circuit, wherein the nonvolatile memory is the external memory device.

* * * * *